United States Patent
Shioga et al.

(10) Patent No.: US 7,778,009 B2
(45) Date of Patent: Aug. 17, 2010

(54) THIN-FILM CAPACITOR AND METHOD OF MANUFACTURING THE SAME

(75) Inventors: Takeshi Shioga, Kawasaki (JP); Masatoshi Ishii, Kawasaki (JP); Kazuaki Kurihara, Kawasaki (JP); Teru Nakanishi, Kawasaki (JP); Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/698,946

(22) Filed: Jan. 29, 2007

(65) Prior Publication Data
US 2007/0176175 A1     Aug. 2, 2007

(30) Foreign Application Priority Data
Jan. 30, 2006  (JP) .............................. 2006-020773
Sep. 27, 2006  (JP) .............................. 2006-263244

(51) Int. Cl.
*H01G 4/06*     (2006.01)
*H01G 4/228*    (2006.01)
*H01G 4/005*    (2006.01)

(52) U.S. Cl. ..................... 361/306.1; 361/311; 361/303

(58) Field of Classification Search ................ 361/311, 361/303, 306.1, 306.3; 257/40
See application file for complete search history.

(56) References Cited

U.S. PATENT DOCUMENTS

| | | | | |
|---|---|---|---|---|
| 5,262,920 A | * | 11/1993 | Sakuma et al. | 361/321.5 |
| 5,346,750 A | * | 9/1994 | Hatakeyama et al. | 428/209 |
| 6,100,190 A | * | 8/2000 | Kobori | 438/659 |
| 6,563,693 B2 | * | 5/2003 | Nakada et al. | 361/523 |
| 2004/0130849 A1 | * | 7/2004 | Kurihara et al. | 361/311 |
| 2005/0146838 A1 | | 7/2005 | Shioga et al. | |

FOREIGN PATENT DOCUMENTS

| JP | 2001-338836 | 12/2001 |
|---|---|---|
| JP | 2004-079801 | 3/2004 |

* cited by examiner

*Primary Examiner*—Eric Thomas
*Assistant Examiner*—David M Sinclair
(74) *Attorney, Agent, or Firm*—Kratz, Quintos & Hanson, LLP

(57) ABSTRACT

A thin-film capacitor element having two conductive films and a dielectric film sandwiched therebetween is provided above a substrate. An inorganic protective film covering the thin-film capacitor element and having a second opening exposing at least a part of the conductive films is provided. An organic protective film covering the thin-film capacitor element from above the inorganic protective film and having a first opening therein, which is larger than the second opening and exposes the second opening, is provided. Besides, a bump connected with the conductive films via the first opening and the second opening is provided.

10 Claims, 14 Drawing Sheets

THIN-FILM CAPACITOR AND METHOD OF MANUFACTURING THE SAME

CROSS-REFERENCE TO RELATED APPLICATIONS

This application is based upon and claims the benefit of priority from the prior Japanese Patent Application Nos. 2006-020773, filed on Jan. 30, 2006, and 2006-263244, filed on Sep. 27, 2006, the entire contents of which are incorporated herein by reference.

BACKGROUND OF THE INVENTION

1. Field of the Invention

The present invention relates to a thin-film capacitor suitable for a decoupling capacitor and a manufacturing method of the same.

2. Description of the Related Art

Conventionally, a circuit wiring board mounts a decoupling capacitor of a stacked chip structure in the vicinity of a semiconductor integrated circuit element thereof as a measure to prevent the semiconductor integrated circuit element from malfunction due to power supply voltage variation and high frequency noise in the substrate. Specifically, the decoupling capacitor is used in electric equipment for a computer or the like.

Further, along with increasing speed and lowering electric power consumption of the semiconductor integrated circuit element in recent years, performance improvement has been demanded in view of capacitance, high-frequency following and so forth. As a capacitor to respond to the demand as described above, a thin-film capacitor making use of a microfabrication technology for a thin film has been developed. The thin-film capacitor is generally composed of two electrode thin films formed on a substrate and a dielectric thin film formed therebetween.

The thin-film capacitor of the above-described type is capable of reducing the distance between the electrodes by the microfabrication, allowing obtaining a structure having low inductance in the high frequency zone.

In addition, a flip-chip bonding using a solder bump is performed as a technology to mount the thin-film capacitor in the vicinity of the semiconductor integrated circuit element on the circuit wiring board with high reliability and at low cost (Patent Application Laid-Open No. 2004-079801 and Japanese Patent Application Laid-Open No. 2001-338836).

Here, the description will be given of a conventional thin-film capacitor with reference to FIG. 11. FIG. 11 is a sectional view showing a structure of the conventional thin-film capacitor. Note that FIG. 11 shows only the vicinity of the solder bump for a bottom electrode.

In the conventional thin-film capacitor, a $SiO_2$ film 52 is formed on a silicon substrate 51 and a $TiO_2$ film 53 is formed thereon as an adhesive film. On the $TiO_2$ film 53, further, a Pt bottom electrode 54, a BST dielectric film 55 and an Au top electrode 56 are stacked sequentially. The Pt bottom electrode 54, the BST dielectric film 55 and the Au top electrode 56 compose a thin-film capacitor element. Note that the BST dielectric film 55 and the Au top electrode 56 have an opening exposing the Pt bottom electrode 54, respectively.

Further, an $Al_2O_3$ protective film 57 and a polyimide protective film 58 having photosensitivity are stacked sequentially all over the surface. With the $Al_2O_3$ protective film 57, moisture or the like is prevented from entering into the thin-film capacitor element from the polyimide protective film 58 being an organic protective film. Note that the $Al_2O_3$ protective film 57 and the polyimide protective film 58 respectively have an opening 59 exposing the Pt bottom electrode 54 from the center of the opening of the BST dielectric film 55 and the Au top electrode 56.

In the opening 59, a Ti film 60 as a base electric conductor and a Cu film 61 serving as a plating seed layer as well as a solder-resistant barrier layer are formed. Further, on the Cu film 61, an Ni plating film 62 filling the opening 59 is formed as a solder barrier layer. Finally, on the Ni plating film 62, a solder bump 63 made of Sn—Ag is formed. When forming the solder bump 63, a solder plating film made of Sn—Ag is formed, and after that, wet back (ball up) is performed to the solder plating film.

The thickness of the respective films composing the thin-film capacitor is about 100 nm and the thickness of the solder plating film is about 70 μm to 100 μm. Therefore, when performing the wet back of the solder plating film (ball up of the plating film) and when mounting to the circuit wiring board, large stress is applied to the respective films composing the thin-film capacitor, in which a peal-off of the film is sometimes caused in the thin-film capacitor.

SUMMARY OF THE INVENTION

The present invention is therefore to provide a thin-film capacitor capable of preventing a peel-off of a film by mitigating stress applied to thin-film capacitor elements, and a manufacturing method of the same.

Here, the result of a stress simulation performed by the present inventors will be described. The simulation was performed under the assumptions that the thickness of the $TiO_2$ film 53 was 20 nm, that of the Pt bottom electrode 54 was 100 nm, that of the BST dielectric film 55 was 100 nm, that of the Au top electrode 56 was 100 nm, that of the $Al_2O_3$ protective film 57 was 100 nm, that of the polyimide protective film 58 was 5 μm, that of the Ti film 60 was 300 nm, that of the Cu film 61 was 250 nm, and that of the Ni plating film 62 was 4 μm. Further, the diameter of the opening 59 was assumed to be 80 μm or 40 μm, that of the solder bump 63 was assumed to be 100 μm, and its height from the upper surface of the Ni plating film 62 was assumed to be 100 μm. Then, residual stress at room temperature was calculated at three points (a point a', a point b', a point c') in FIG. 11 on the assumption that a stress release point (stress free) was at 220° C. The result is shown in Table 1 below.

TABLE 1

|  | Point a' (MPa) | Point b' (MPa) | Point c' (MPa) |
|---|---|---|---|
| Diameter: 80 μm | 810 | 1650 | 790 |
| Diameter: 40 μm | 600 | 1160 | 800 |

As shown in Table 1, at the point c' positioning at the border between the polyimide protective film 58 and the Ti film 60 and at the upper end of the edge of the opening 59, the residual stress showed little change regardless of the diameter of the opening 59. Meanwhile, at the point b' positioning at the border between the polyimide protective film 58 and the $Al_2O_3$ protective film 57 and at the edge of the opening 59, and the point a' positioning at the border between the $TiO_2$ film 53 and the $SiO_2$ film 52 and beneath the edge of the opening 59, the stress reduced as the diameter of the opening 59 reduced. Note that the point b' positions also at the border between the Ti film 60 and the $Al_2O_3$ protective film 57 at the edge of the opening 59, where the film is considered most likely to peel off.

Based on the result, in order to prevent the film from peeling off due to the stress affecting the film composing the thin-film capacitor, it is considered to be effective that the diameter of the opening 59 is reduced. However, from a practical standpoint, it is not easy to reduce the diameter of the opening 59. The reason thereof will be described with reference to FIG. 12. FIG. 12 is a view reproducing a photomicrograph of the section in the vicinity of the electrode and the solder bump of an actual thin-film capacitor.

In FIG. 11, the edge of the opening 59 is assumed to be vertical to the surface of the silicon substrate 51, however, in actual, the edge of the opening 59 slopes and thereby forms a taper portion 64 in the polyimide protective film 58. Specifically, the diameter of the opening 59 is gradually reduced, as it comes close to the silicon substrate 51. It is thereby considered that, backed by the existence of such a structure, the stress from the solder bump 63 made of Sn—Ag is absorbed by the taper portion 64 of the polyimide protective film 58.

Thus, in the thin-film capacitor, the polyimide protective film 58 serves as a buffer absorbing the stress from the solder bump 63, so that the thickness of the polyimide protective film 58 is generally 3 μm to 6 μm being thicker.

Accordingly, the polyimide protective film 58 needs to have the taper portion 64, in which the diameter of the opening 59 cannot be reduced sufficiently. Further, the processing precision (resolution) of the photosensitive polyimide is limited in that the photosensitive polyimide has characteristic limitation, so that the diameter of the opening 59 has limitation in reduction.

After due diligent efforts to bring a solution to such a problem, the present inventors has devised embodiments as will be described below.

A thin-film capacitor according to the present invention includes: a thin-film capacitor element having two conductive films and a dielectric film sandwiched therebetween; an inorganic protective film covering the thin-film capacitor element and having a second opening formed therein, the second opening exposing at least a part of the conductive film; and an organic protective film covering the thin-film capacitor element from above the inorganic protective film and having a first opening formed therein, the first opening exposing the second opening and being larger than the second opening. Besides, a bump is connected with the conductive film via the first and second openings.

In a manufacturing method of a thin-film capacitor according to the present invention, a thin-film capacitor element having two conductive films and a dielectric film sandwiched therebetween is formed above a substrate, and after that, an inorganic protective film covering the thin-film capacitor element is formed. Subsequently, the organic protective film covering the thin-film capacitor element from above the inorganic protective film is formed. Next, a first opening is formed in the organic protective film. Then, at such a portion of the inorganic protective film that is exposed from the first opening, a second opening being smaller than the first opening and exposing at least a part of the conductive films is formed. Thereafter, a bump to be connected with the conductive film via the first and second openings is formed.

FIG. 1 is a view showing an example of the thin-film capacitor according to the present invention. FIG. 1 is a view showing a theoretical structure of the present invention. Here, with reference to FIG. 1, an approach in the present invention to solve the technical problem will be described.

As shown in FIG. 1, a thin-film capacitor element 2 having two conductive films 3, 5 and a dielectric film 4 sandwiched therebetween is provided above a substrate 1. There is provided an inorganic protective film 6 covering the thin-film capacitor element 2 and having second openings 9 exposing at least a part of the conductive films 3 and 5, respectively. As in FIG. 11, FIG. 1 shows only the vicinity of the solder bump for the bottom electrode, so that only the second opening 9 exposing the part of the conductive film 3 is shown in the drawing. There is provided an organic protective film 7 covering the thin-film capacitor element 2 from above the inorganic protective film 6 and having therein a first opening 8 exposing the second opening 9 and being larger than the second opening 9. Then, a bump 10 connected with the conductive film(s) 3 (and 5) via the first opening 8 and the second opening 9 is provided. FIG. 1 shows only the vicinity of the solder bump for the bottom electrode, so that only the bump 10 connected with the conductive film 3 is shown in FIG. 1, however, a bump connected with the conductive film 5 via the first opening 8 and the second opening 9 is provided on the top electrode side.

By adopting the structure as described above, the stress at the edge (point d) of the second opening 9, at which the peeling off of the film is most likely to be caused, can be reduced to smaller than that applied to the other portion. Hence, the peeling off of the film can be prevented. The point d is the point positioning at the border between the bump 10 and the inorganic protective film 6 at the edge of the second opening 9. In addition, a point a, a point b and a point c in FIG. 1 correspond to the point a', the point b' and the point c' in FIG. 11, respectively.

Note that the microfabrication performed to the inorganic protective film 6 is easier than that performed to the organic protective film 7. Further, the inorganic protective film 6 is not required a function absorbing the stress, and the organic protective film 7 fulfills the function, in which even the inorganic protective film 6 of an extremely small thickness causes no problem related to the stress.

Note that, as a result of a simulation performed by the present inventors with respect to the structure shown in FIG. 1, it was found that the diameter of the second opening 9 is preferably one eighth of the diameter of the first opening 8 or less, in which the peeling off of the film can be prevented effectively.

Here, the description will be given of the result of the above-described stress simulation performed with respect to the structure shown in FIG. 1. The simulation was performed on the assumption that the thickness of the conductive film 3 was 100 nm, that of the dielectric film 4 was 100 nm, that of the conductive film 5 was 100 nm, that of the inorganic protective film 6 was 100 nm and that of the organic protective film 7 was 5 μm. Further, it was assumed that a $TiO_2$ film of a thickness of 20 nm existed between the substrate 1 and the conductive film 3. Furthermore, it was assumed that the bump had a structure in which a solder bump of a diameter of 100 μm was formed on stacked layers of a Ti film of a thickness of 300 nm, a Cu film of a thickness of 250 nm and an Ni plating film of a thickness of 4 μm. Moreover, it was assumed that the height of the solder bump from the upper surface of the Ni plating film was 100 μm. Further, it was assumed that the diameter of the first opening 8 was 80 μm and the diameter of the second opening 9 was 10 μm. Then, the residual stress at room temperature was calculated for four points (the point a, the point b, the point c and the point d) in FIG. 1 on the assumption that a stress release point (stress free) was at 220° C. The result is shown in Table 2 below.

TABLE 2

| Point a (MPa) | Point b (MPa) | Point c (MPa) | Point d (MPa) |
|---|---|---|---|
| 570 | 1550 | 810 | 450 |

As shown in Table 2, although the stresses at the point b and the point c did not show large change from the stresses at the point b' and the point c', the stress at the point a decreased sharply from the stress at the point a'. Further, when the point d is assumed to correspond to the point b', the stress at the point d decreased sharply from the stress at the point b'. Accordingly, it can be said that the stress can be mitigated sufficiently by making the diameter of the second opening 9 to be one eighth of the diameter of the first opening 8. It is considered that, as the second opening 9 becomes smaller, the stress can be mitigated as well, so that the diameter of the second opening 9 is preferably one eighth of the diameter of the first opening 8 or lower. Note that even when the second opening 9 has a smaller diameter, a larger contact area of a metal layer being the lowest layer of the bump 10 and the bump body thereon can be ensured.

DETAILED DESCRIPTION OF THE PREFERRED EMBODIMENTS

Hereinafter, embodiments according to the present invention will be specifically described with reference to the attached drawings. Note that, for the purpose of convenience, structures of thin-film capacitors will be described together with a manufacturing method of the same.

First Embodiment

First, a first embodiment according to the present invention will be described. FIGS. 2A to 2H are sectional views showing the manufacturing method of a thin-film capacitor according to the first embodiment of the present invention in the order of steps.

Figure 1:
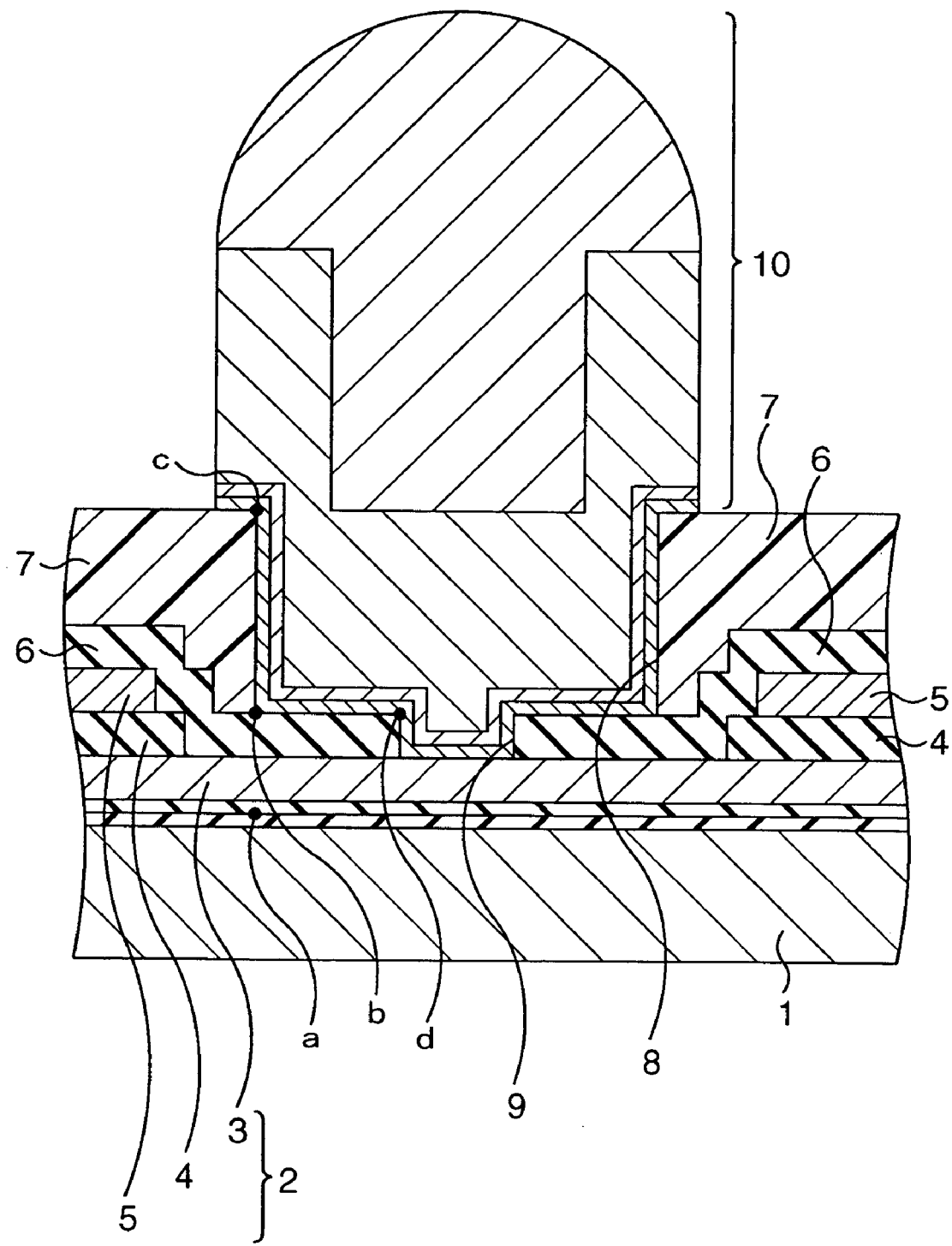
FIG. 1 is a view showing a theoretical structure of the present invention.
Figure 2A:
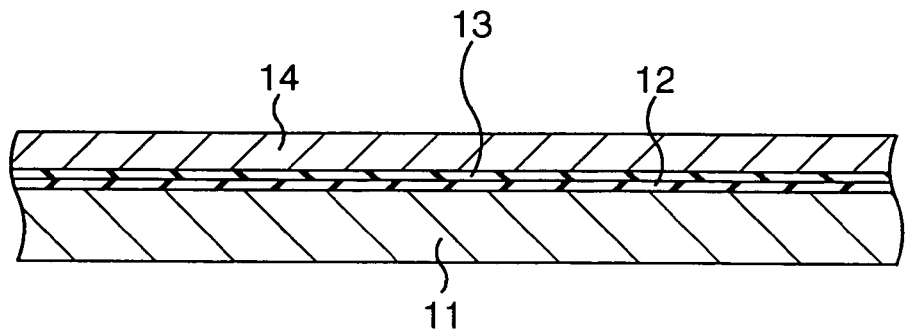
FIGS. 2A to 2H are sectional views showing a manufacturing method of a thin-film capacitor according to a first embodiment of the present invention in the order of steps.

First, as shown in FIG. 2A, as an adhesive layer, a $TiO_2$ film 13 of a thickness of, for example, 20 nm is formed by a spattering method on a silicon substrate 11 having a $SiO_2$ film (silicon oxide film) 12 formed by oxidization on the surface thereof. Subsequently, as a bottom electrode, a Pt film 14 of a thickness of, for example, 100 nm is formed on the $TiO_2$ film 13 by a spattering method. The film forming conditions for the spattering of the $TiO_2$ film 13 are: substrate temperature; 500° C., RF power; 200 W, gas pressure; 0.1 Pa, and $Ar/O_2$ ratio; 5/1, for example. Further, the film forming conditions for the spattering of the Pt film 14 are: substrate temperature; 400° C., DC power; 100 W, and gas pressure; 0.1 Pa, for example.

Figure 2B:
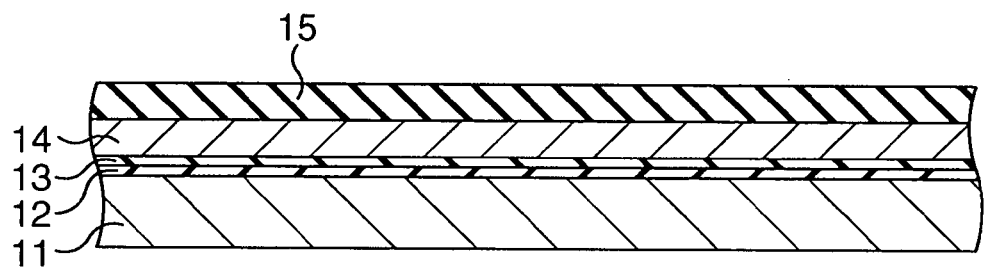

Subsequently, as shown in FIG. 2B, as a capacitor dielectric film, a BST ($Ba_xSr_{1-x}TiO_3$) film 15 of a thickness of, for example, 90 nm to 100 nm is formed on the Pt film 14 by a spattering method. The BST film 15 is an oxide film containing Ba, Sr and Ti. The BST has a relatively large relative dielectric constant (1500 in the case of bulk) and thereby is an effective material to realize a small-sized capacitor having large capacitance. The film forming conditions for the spattering of the BST film 15 are: substrate temperature; 600° C., RF power; 800 W, gas pressure; 0.5 Pa, and $Ar/O_2$ ratio; 4/1, for example. As a result, the BST film 15 having a thickness of 100 nm, a dielectric constant of 400 and a dielectric loss of 1% or below can be obtained as a dielectric film.

Figure 2C:
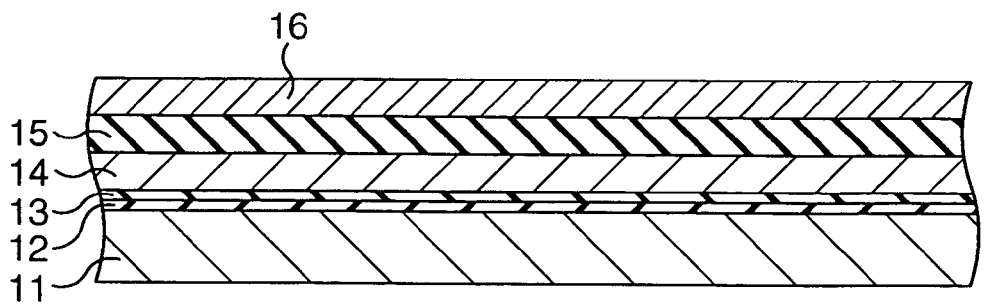

Subsequently, as shown in FIG. 2C, as a top electrode, an Au film 16 of a thickness of, for example, 100 nm is formed on the BST film 15 by a spattering method. The Pt film 14, the BST film 15 and the Au film 16 compose a thin-film capacitor element.

Figure 2D:
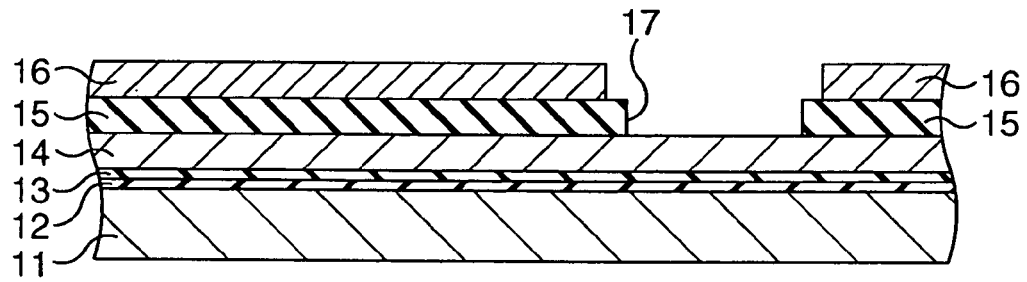

Subsequently, as shown in FIG. 2D, a resist pattern (not shown) having an opening formed therein to expose the bottom electrode is formed by a photolithography method, and after that, the Au film 16 and the BST film 15 are dry etched sequentially by an Ar ion milling method. As a result, an opening 17 is formed in the Au film 16 and the BST film 15. The diameter of the opening 17 is, for example, 120 μm in the BST film 15.

Figure 2E:
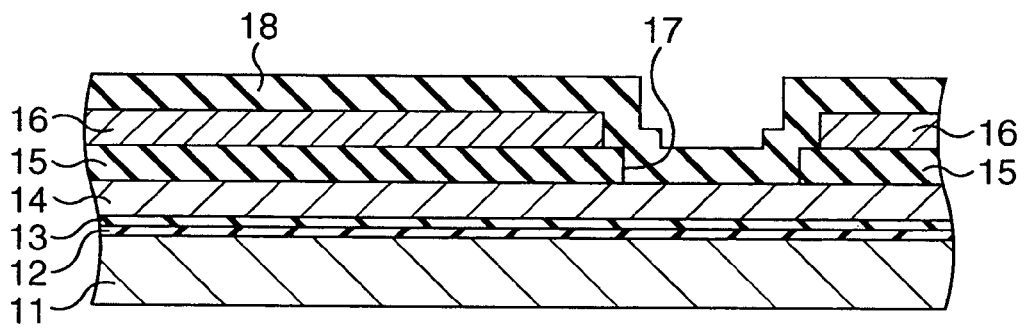

Subsequently, as shown in FIG. 2E, an $Si_3Ni_4$ film (silicon nitrided film) 18 of a thickness of, for example, 150 nm is formed in the opening 17 and on the Au film 16 as a moisture-resistant inorganic protective film by a spattering method. The film forming conditions for the spattering of the $Si_3Ni_4$ film 18 are: substrate temperature; 200° C., RF power; 500 W, gas pressure; 0.1 Pa, and $Ar/O_2$ ratio; 5/1, for example.

Figure 2F:
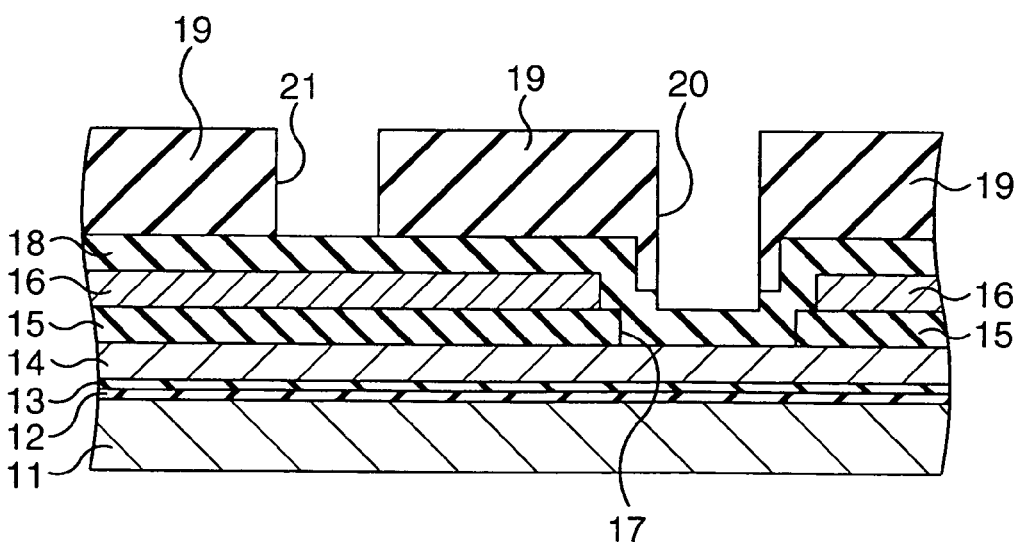

Subsequently, a film of a thickness of, for example, 6 μm is formed by spin-coating varnish of photosensitive polyimide resin at a spinning speed of, for example, 3000 rpm for 30 seconds. Subsequently, for example, a pre-baking at a temperature of 60° C. for 10 minutes is performed, and after that, exposure and development are performed. Further, by performing main baking at a temperature of 375° C. for 2 hours, a polyimide film 19 of a thickness of, for example, 4 μm is formed as an organic protective film, as shown in FIG. 2F. With the polyimide film 19, the electrodes (the Au film 16 and the Pt film 14) are protected.

Note that, in the exposure and development after the pre-baking, an opening 20 that is enclosed in the opening 17 in plain view is formed, and further an opening 21 is formed at a position distant from the opening 17 as well. The diameters of the opening 20 and the opening 21 are, for example, 30 μm.

Figure 2G:
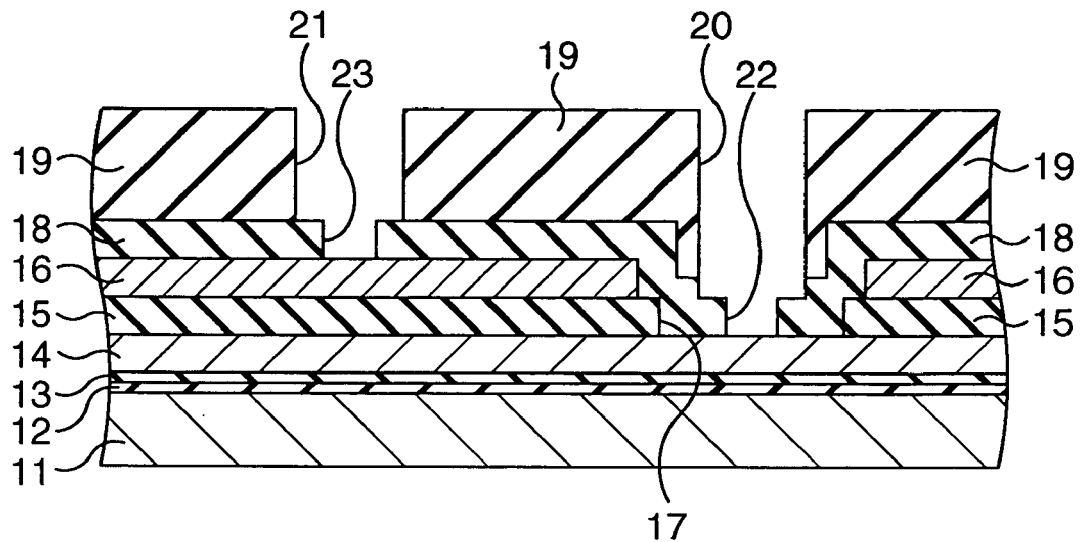

Subsequently, after forming a resist pattern (not shown) having openings that are enclosed in the opening 20 and the opening 21 in plain view is formed by a photolithography method, the $Si_3Ni_4$ film 18 exposed from the openings is dry-etched by an Ar ion milling method. As a result, as shown in FIG. 2G, an opening 22 is formed in the $Si_3Ni_4$ film 18 in the opening 20 and an opening 23 is formed in the $Si_3Ni_4$ film 18 in the opening 21. The Pt film 14 (bottom electrode) is exposed from the openings 20 and 22, and the Au film 16 (top electrode) is exposed from the openings 21 and 23. The diameters of the openings 22 and 23 are, for example, 3 μm, which is in a range of 10 μm or below.

Figure 2H:
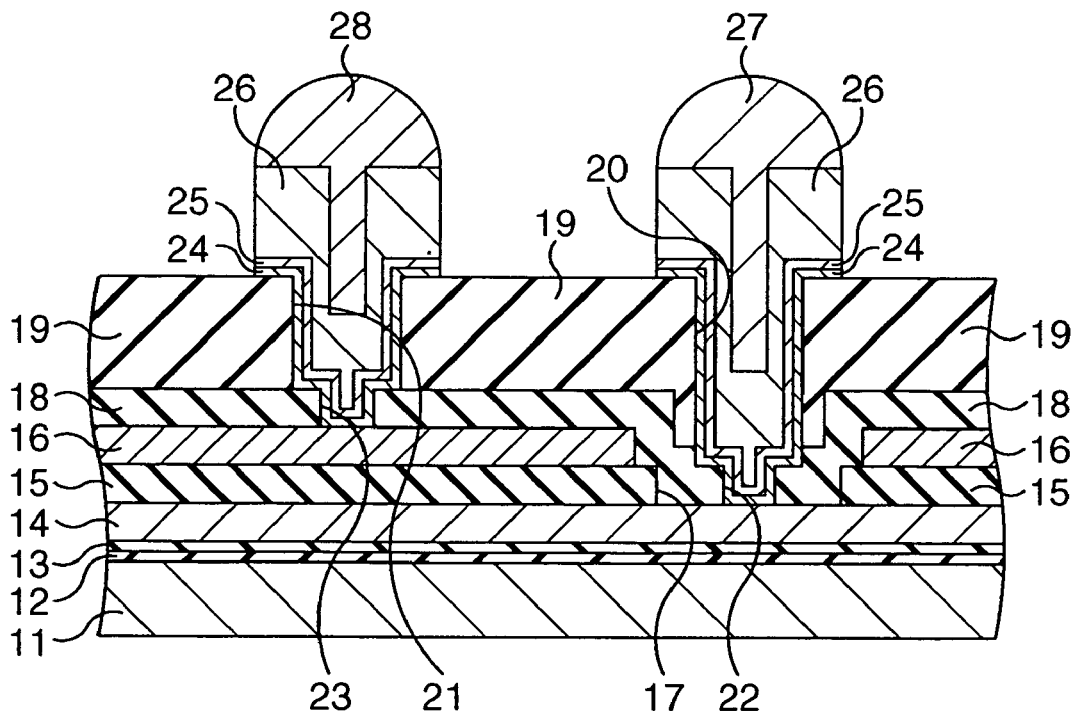

Subsequently, as shown in FIG. 2H, as a base conductive film, a Ti film 24 of a thickness of, for example, 300 nm is formed in each of the openings 20 to 23 by a spattering method. Subsequently, as a plating seed layer, a Cu film 25 of a thickness of, for example, 250 nm is formed on the Ti film 24 by a spattering method. After that, an Ni plating layer 26 of a thickness of, for example, 4 μm is formed by an electrolytic plating method. As a result of this, an UBM (under bump metal) of an Ni/Cu/Ti structure is formed. Subsequently, an Sn—Ag solder film is formed to form solder bumps 27 and 28 of a diameter of, for example, 100 μm and of a height from the Ni plating layer 26 of 100 μm by a wet-back processing. The solder bump 27 is one for the bottom electrode and the solder bump 28 is another one for the top electrode. Through these processings, a basic structure of the thin-film capacitor is completed.

Figure 3:
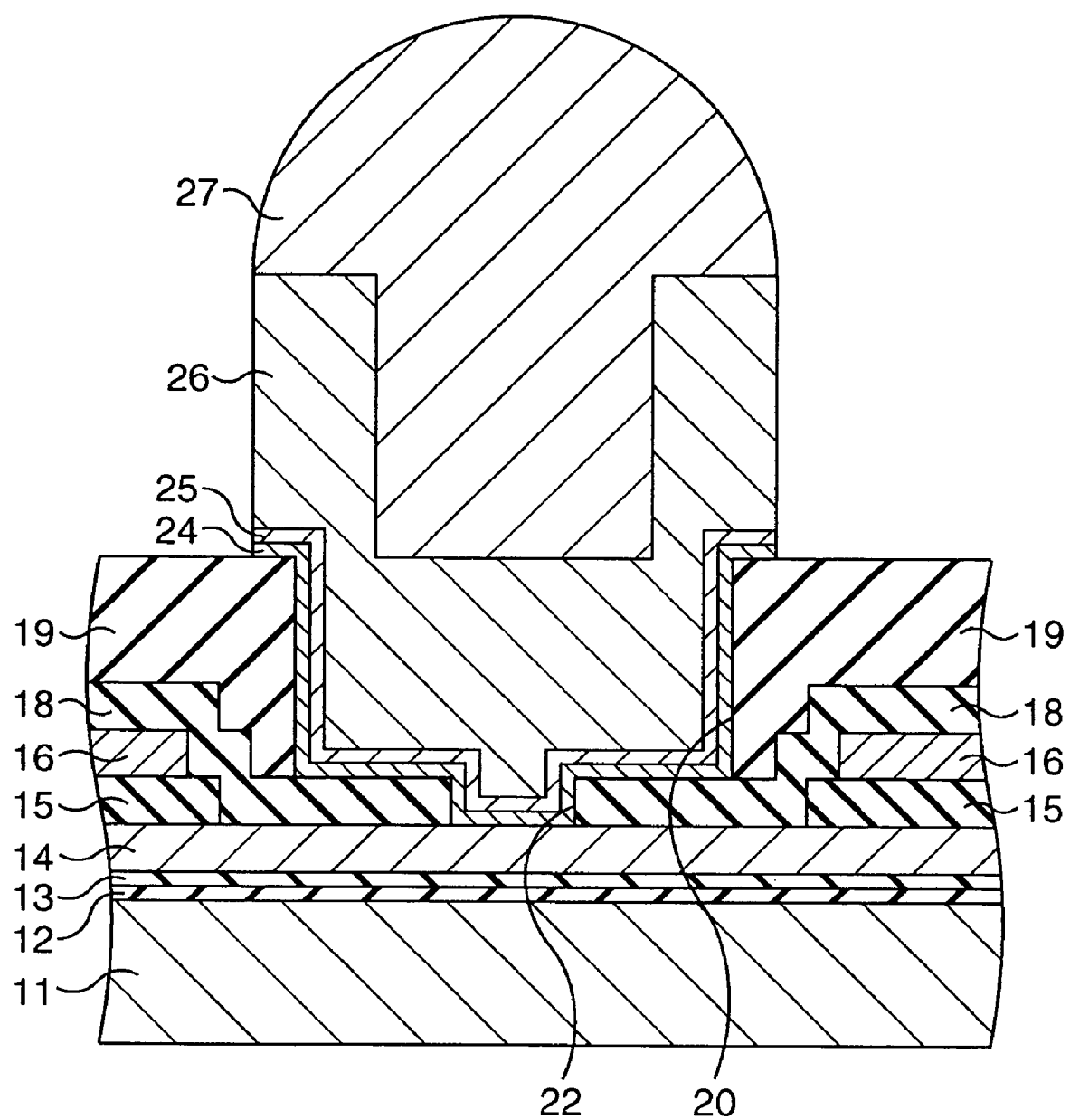
FIG. 3 is a sectional view showing a vicinity of a solder bump 27 of the thin-film capacitor according to the first embodiment in an enlarged manner.

FIG. 3 is a sectional view showing the vicinity of the solder bump 27 of the thin-film capacitor according to the first embodiment in an enlarged manner. As shown in FIG. 3, the solder bump 27 is electrically connected with the Pt film 14 (bottom electrode) in the opening 22 formed in the $Si_3Ni_4$ film 18 via the UBM. It is not shown in the drawing though, the solder bump 28 for the top electrode is electrically connected with the Au film 16 (top electrode) in the opening 23 formed in the $Si_3Ni_4$ film 18 via the UBM.

Thus, in the first embodiment, the small openings 22 and 23 of a diameter of 10 μm or below, namely about 3 μm here, are formed in the $Si_3Ni_4$ film 18 serving as the moisture-resistant protective film and exposed inside the openings 20 and 21 formed in the polyimide film 19. The $Si_3Ni_4$ film 18 is made of an inorganic material and has a small thickness of about 100 nm, allowing highly-precise microfabrication by a photolithography method and a dry etching method. Therefore, according to the present embodiment, it is easily possible to obtain the structure that can prevent the peel-off of the film by mitigating the stress.

Second Embodiment

Figure 4:
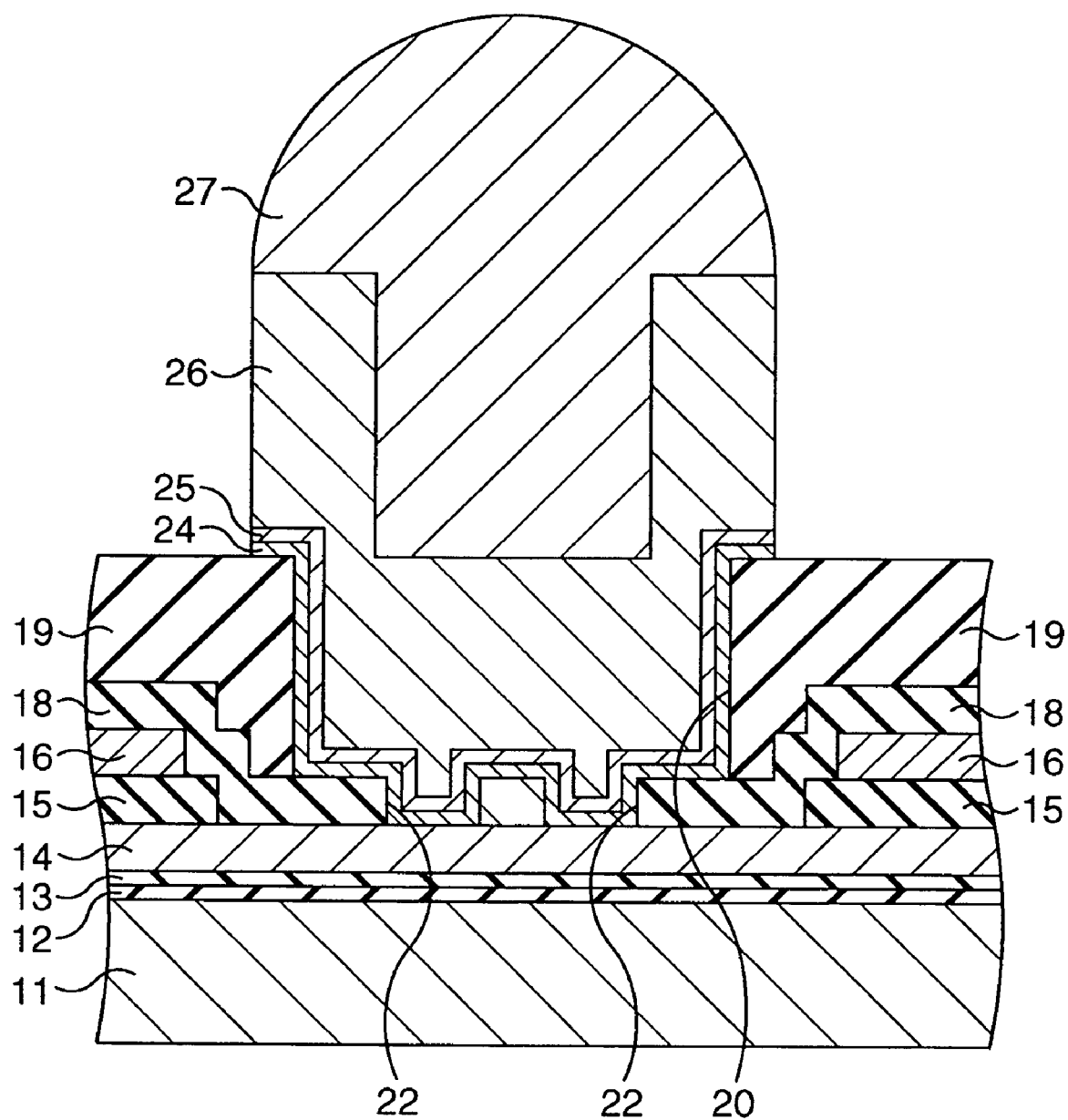
FIG. 4 is a sectional view showing the vicinity of the solder bump 27 of the thin-film capacitor according to a second embodiment in an enlarged manner.

Next, a second embodiment according to the present invention will be described. FIG. 4 is a sectional view showing the vicinity of the solder bump 27 of the thin-film capacitor according to the second embodiment in an enlarged manner. In the second embodiment, the two openings 22 are formed in the $Si_3Ni_4$ film 18 for the single solder bump 27. It is not shown in the drawing though, the two openings 23 are formed in the $Si_3Ni_4$ film 18 for the single solder bump 28. The diameters of the opening 22 and 23 are, for example, 2 μm. The other structure is the same as in the first embodiment.

According to the second embodiment as described above, the diameters of the openings 22 and 23 are smaller than those of the first embodiment, so that the stress affecting the peel-off of the film can be reduced to smaller as compared to the first embodiment. In addition, the number of the openings 22 and 23 is larger than that of the first embodiment, so that the contact area of the solder bump 27 and the Pt film 14 via the UBM and the contact area of the solder bump 28 and the Au film 16 via the UBM are larger than those of the first embodiment. Accordingly, the contact resistance between these can be reduced to smaller.

Note that the number of the openings 22 and 23 for the single solder bump 27 or the single solder bump 28 is not limited to two, and more than two is also acceptable. In addition, in order to form the plural openings 22 and 23, what to do is only to change the resist pattern used in the formation of the openings 22 and 23.

Third Embodiment

Figure 5:
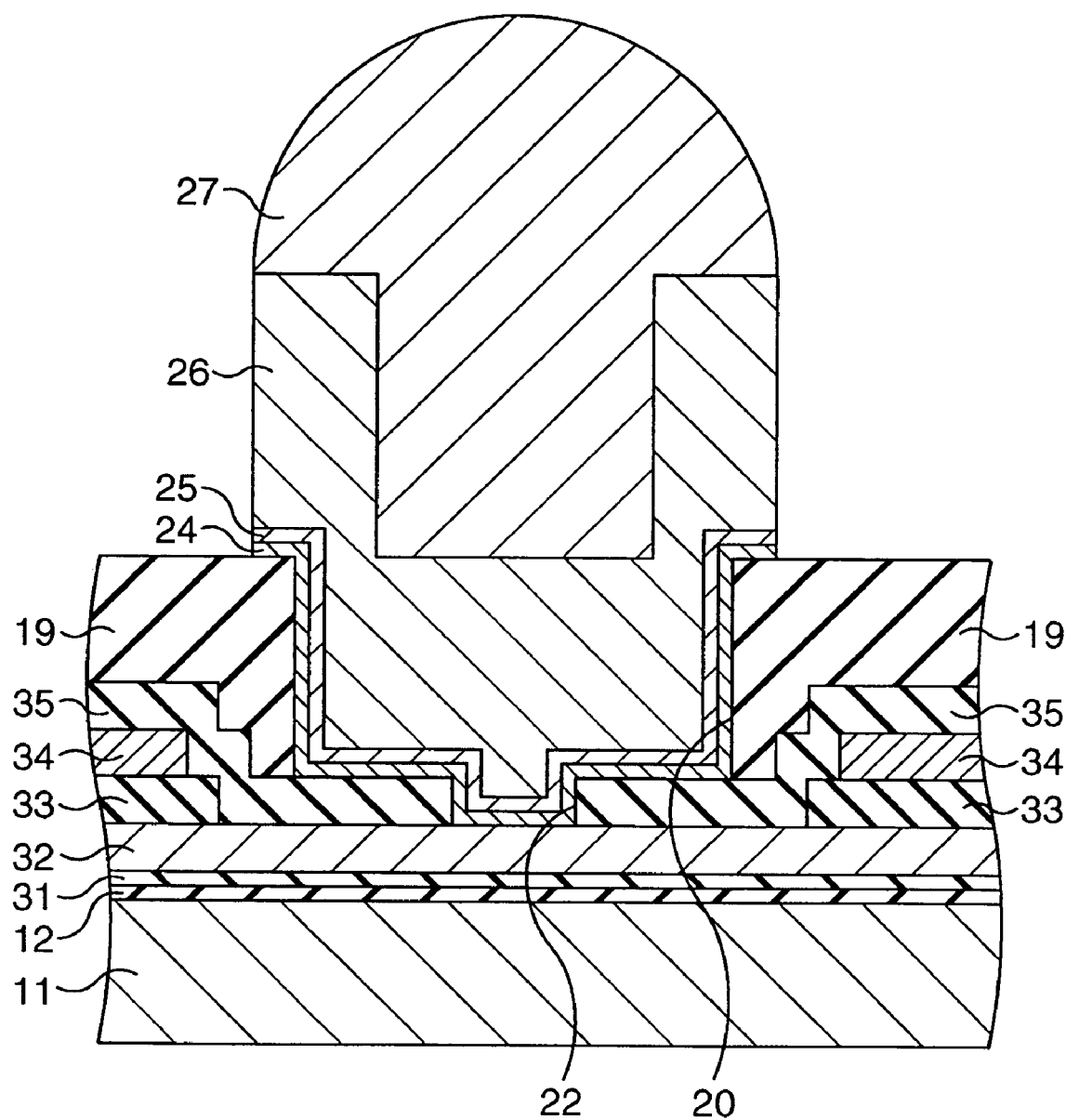
FIG. 5 is a sectional view showing the vicinity of the solder bump 27 of the thin-film capacitor according to a third embodiment in an enlarged manner.

Next, a third embodiment according to the present invention will be described. FIG. 5 is a sectional view showing the vicinity of the solder bump 27 of the thin-film capacitor according to the third embodiment in an enlarged manner. In the third embodiment, a part of the manufacturing method thereof is different from the first embodiment.

In the third embodiment, first, as in the first embodiment, as an adhesive layer, a $TiO_2$ film 31 of a thickness of, for example, 20 nm is formed on the silicon substrate 11 having the $SiO_2$ film 12 formed on the surface thereof by a spattering method. Subsequently, as a bottom electrode, a Pt film 32 of a thickness of, for example, 100 nm is formed on the $TiO_2$ film 31 by a spattering method. The film forming conditions for the spattering of the $TiO_2$ film 31 is: substrate temperature; 500° C., RF power; 200 W, gas pressure; 0.1 Pa, and $Ar/O_2$ ratio=5/1, for example. Further, the film forming conditions for the spattering of the Pt film 32 is: substrate temperature; 400° C., DC power; 100 W, and gas pressure; 0.1 Pa, for example.

Subsequently, a film of a starting solution made of alkoxide containing Ba, Sr and Ti is formed by a spin coating method (2000 rpm/30 seconds) at a thickness of about 100 nm per one spin-coat process. Subsequently, the BST is made crystallized by performing a pre-baking at a temperature of 400° C. for 10 minutes followed by main baking at a temperature of 700° C. for 10 minutes. The pre-baking and main baking discharge liquid in the film, so that a BST film 33 of a thickness of, for example, 100 nm in the end can be obtained, as shown in FIG. 5. The relative dielectric constant of the BST film 33 is about 300 and the dielectric loss thereof is 2% or less. Specifically, in the third embodiment, the BST film 33 is formed by a sol-gel method.

Subsequently, as shown in FIG. 5, in the state where the substrate is at a temperature of 400° C., as a top electrode, an $IrO_2$ film 34 of a thickness of, for example, 100 nm is formed on the BST film 33. The Pt film 32, the BST film 33 and the $IrO_2$ film 34 compose a thin-film capacitor element.

Subsequently, a resist pattern (not shown) having an opening formed therein to expose the bottom electrode is formed by a photolithography method, and after that, the $IrO_2$ film 34 and the BST film 33 are dry etched sequentially by an Ar ion milling method. As a result of this, an opening is formed in the $IrO_2$ film 34 and the BST film 33. The diameter of the opening is, for example, 120 μm in the BST film 33.

Subsequently, on the $IrO_2$ film 34 and in the opening, as a moisture-resistant inorganic protective film, an $Al_2O_3$ film 35 of a thickness of, for example, 100 nm is formed by a spattering method. The film forming conditions for the spattering of the $Al_2O_3$ film 35 is: substrate temperature; 80° C., $Ar/O_2$ ratio; 5/1, gas pressure; 0.1 Pa, and RF power; 500 W, for example. Note that the film density of the $Al_2O_3$ film 35 is preferably 2.6 $g/cm^3$ or more. This is to ensure sufficient moisture resistance.

Subsequently, as in the first embodiment, the polyimide film 19 made of the photosensitive polyimide resin is formed and the opening 20 for the bottom electrode and the opening 21 (not shown) for the top electrode are formed in the polyimide film 19. In the present embodiment, the diameters of the opening 20 and 21 are, for example, 40 μm. Further, as in the first embodiment, the resist pattern (not shown) having the openings that are enclosed in the openings 20 and 21 in plane view are formed by a photolithography method, and after that, the $Al_2O_3$ film 35 is dry etched by an Ar ion milling method. As a result of this, the opening 22 is formed in the $Al_2O_3$ film 35 in the opening 20, and the opening 23 is formed in the $Al_2O_3$ film 35 in the opening 21. In the present embodiment, the diameter of the openings 22 and 23 are, for example, 2 μm.

After that, as in the first embodiment, the UBM (under bump metal) and the solder bumps 27 and 28 are formed on each electrode to complete the basic structure of a thin-film capacitor according to the third embodiment.

The same effect as in the first embodiment can be obtained as well by the third embodiment as described above. Thus, the dielectric film composing the thin-film capacitor element may be formed by a sol-gel method. Further, as a top electrode, the $IrO_2$ film can be used in place of the Au film. Furthermore, as an inorganic protective film, the $Al_2O_3$ film, which is superior in moisture resistance and oxidation-reduction resistance similar to the $Si_3N_4$ film, can be used.

Fourth Embodiment

Figure 6:
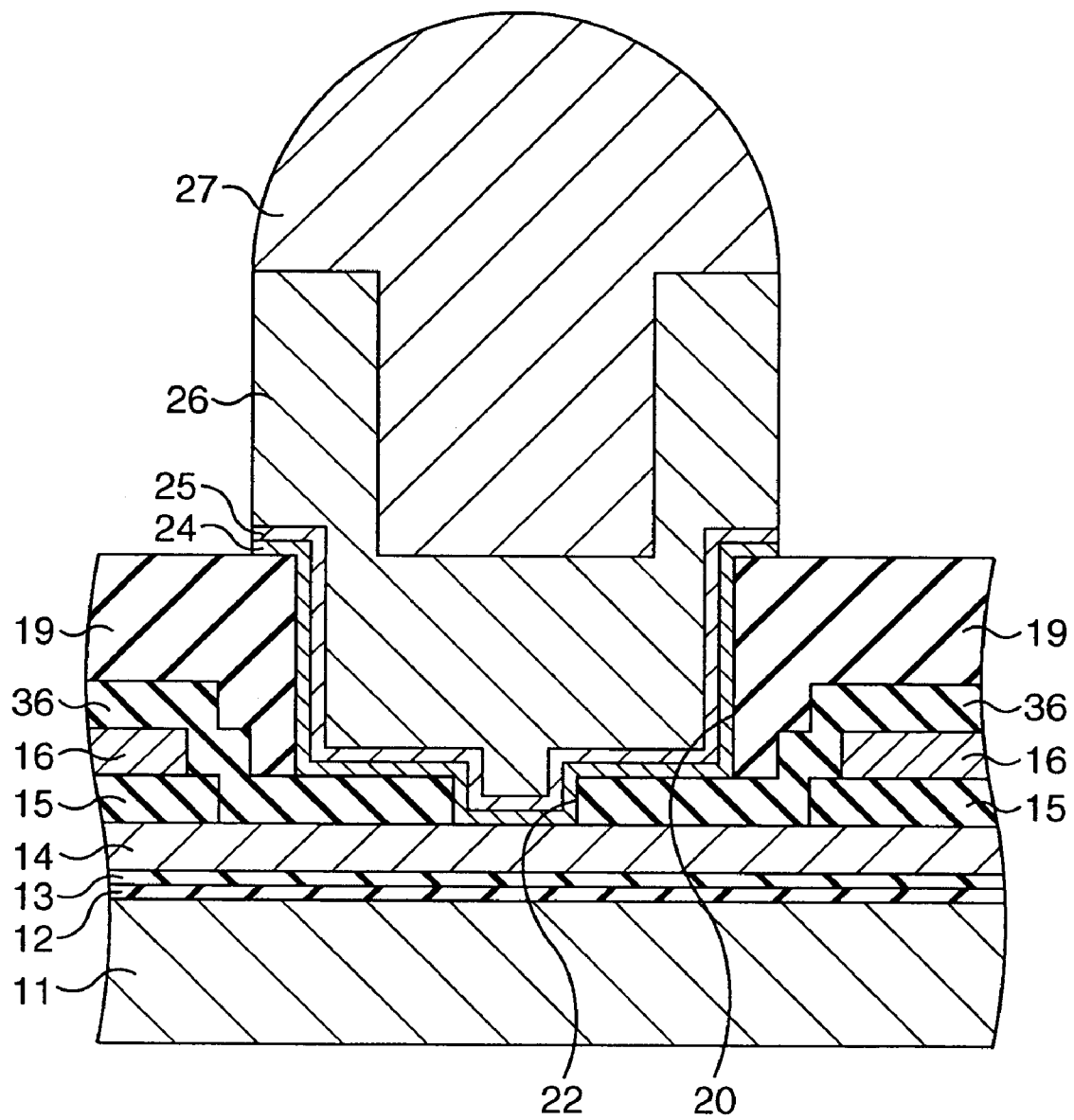
FIG. 6 is a sectional view showing the vicinity of the solder bump 27 of the thin-film capacitor according to a fourth embodiment in an enlarged manner.

Next, a fourth embodiment according to the present invention will be described. FIG. 6 is a sectional view showing the vicinity of the solder bump 27 of the thin-film capacitor according to the fourth embodiment in an enlarged manner.

In the fourth embodiment, as a moisture-resistant inorganic protective film, an amorphous BST film 36 of a thickness of, for example, 150 nm is formed in place of the $Si_3Ni_4$ film 18. The other structure is the same as in the first embodiment.

According to the fourth embodiment as described above, as a material for the moisture-resistant protective film, the same BST as in the dielectric film of the thin-film capacitor element is used, so that the adhesiveness between the dielectric film (BST film 15) and the moisture-resistant protective film (amorphous BST film 36) is enhanced further. Further, they have the same coefficient of thermal expansion, and they are hard to suffer mechanical stress, so that the peel-off of the film can be prevented more effectively.

Note that the amorphous BST film 36 can be formed by a spattering method after the formation of the opening 17. Further, the film forming conditions for the spattering of the amorphous BST film 36 is: substrate temperature; 50° C., $Ar/O_2$ ratio; 8/1, gas pressure; 0.2 Pa, and RF power; 800 W, for example. Thus, by forming the amorphous BST film 36 at a low temperature, it is possible to make the amorphous BST film 36 in the amorphous state without crystallizing it. The processing followed is the same as in the first embodiment.

Fifth Embodiment

Figure 7:
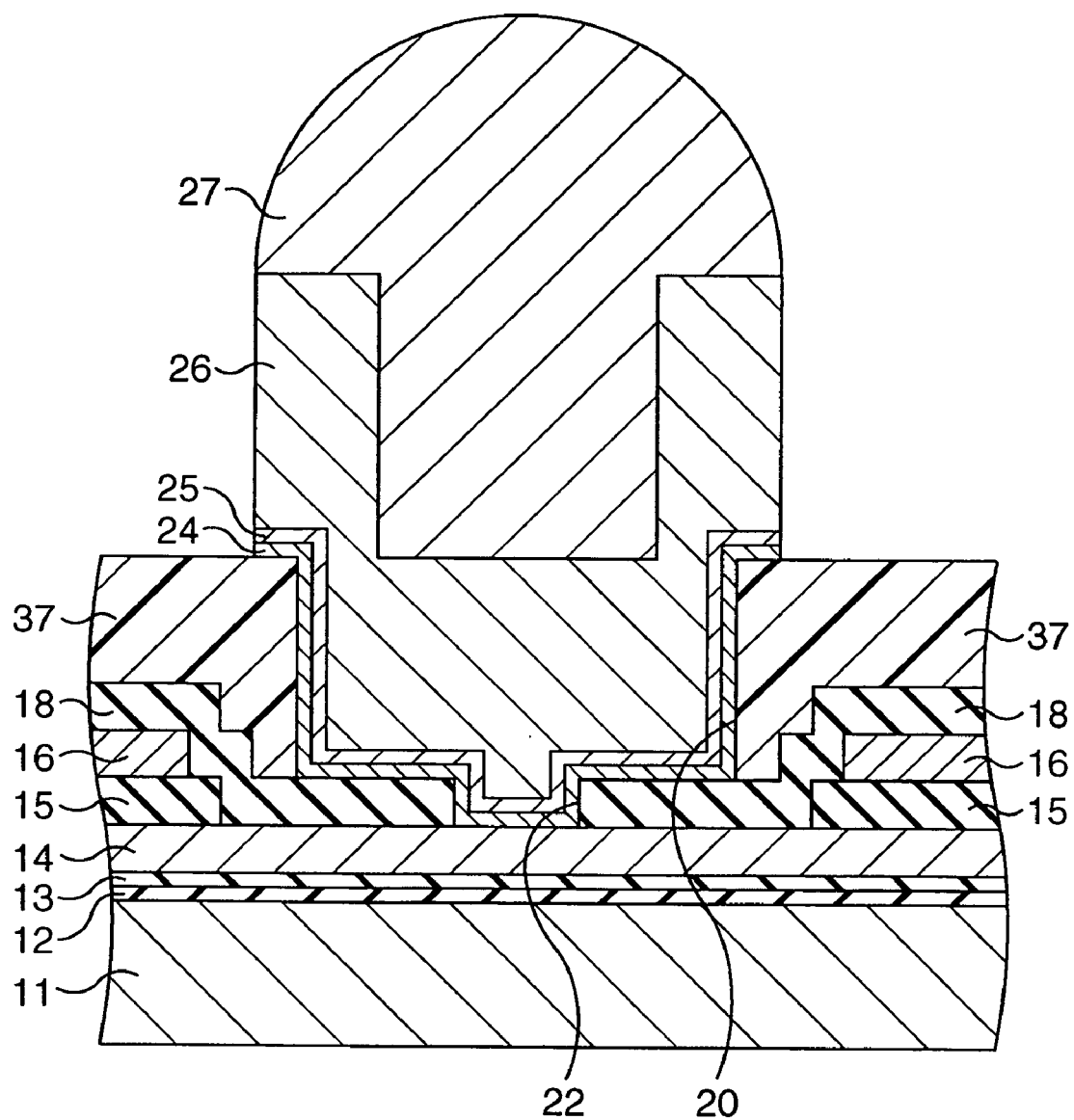
FIG. 7 is a sectional view showing the vicinity of the solder bump 27 of the thin-film capacitor according to a fifth embodiment in an enlarged manner.

Next, a fifth embodiment according to the present invention will be described. FIG. 7 is a sectional view showing the vicinity of the solder bump 27 of the thin-film capacitor according to the fifth embodiment in an enlarged manner.

In the fifth embodiment, as an organic protective film, an epoxy resin film 37 of a thickness of, for example, 6 μm is formed in place of the photosensitive polyimide film 19. The other structure is the same as in the first embodiment.

The same effect as in the first embodiment can be obtained as well by the fifth embodiment as described above.

Incidentally, in order to form the epoxy resin film 37, after the formation of the $Si_3Ni_4$ film 18, a film of a thickness of, for example, 10 μm is formed first by spin coating an epoxy resin varnish at a speed of, for example, 2000 rpm for 30 seconds. Subsequently, for example, a pre-baking at a temperature of 60° C. is performed for 10 minutes, and after that, exposure and development are performed. Further, a main baking at a temperature of 300° C. is performed to form the epoxy resin film 37 of a thickness of 6 μm. The processing followed is the same as in the first embodiment.

Sixth Embodiment

Figure 8:
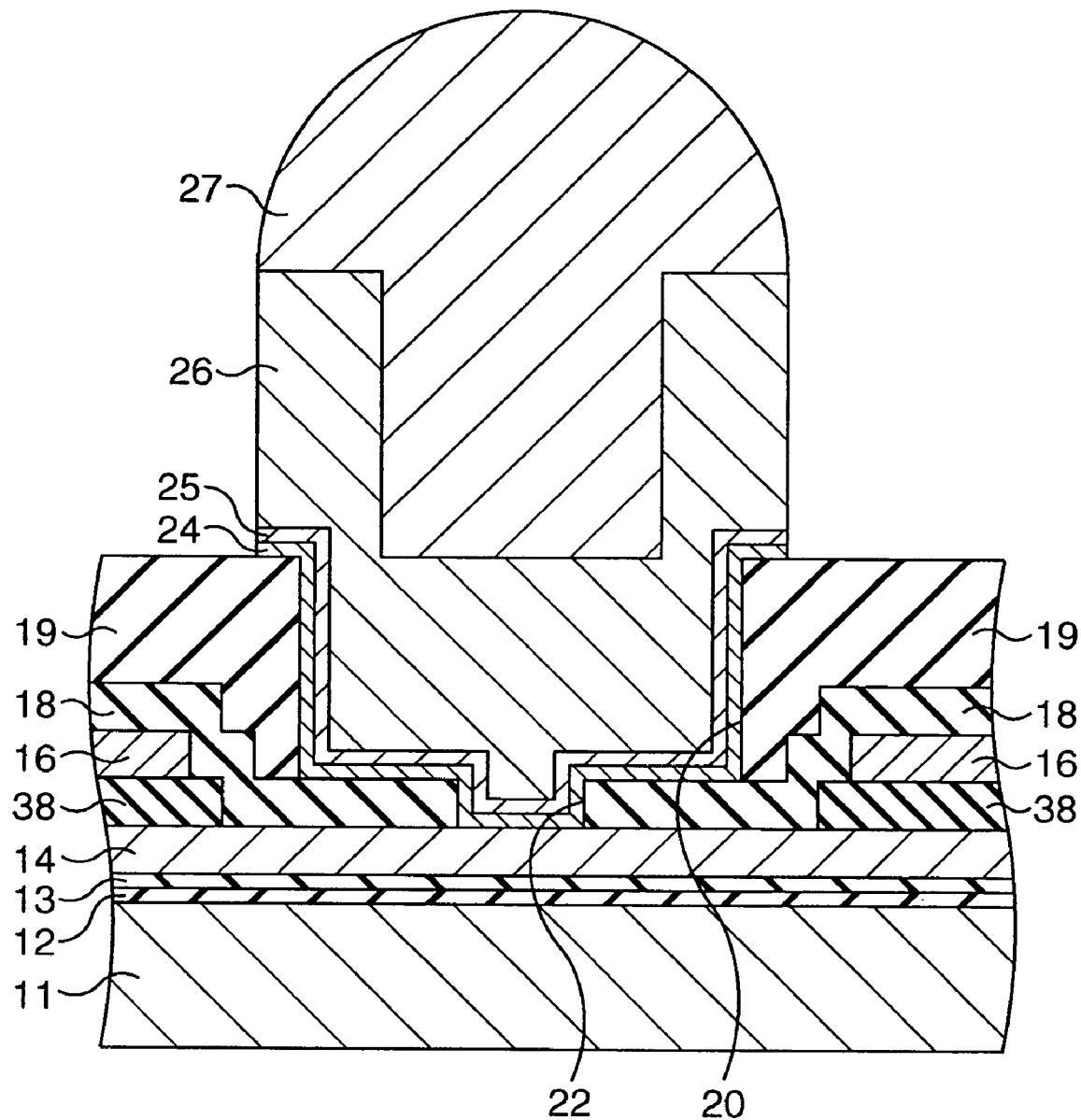
FIG. 8 is a sectional view showing the vicinity of the solder bump 27 of the thin-film capacitor according to a sixth embodiment in an enlarged manner.

Next, a sixth embodiment according to the present invention will be described. FIG. 8 is a sectional view showing the vicinity of the solder bump 27 of the thin-film capacitor according to the sixth embodiment in an enlarged manner.

In the sixth embodiment, as a capacitor dielectric film composing the thin-film capacitor element, a PZT (Pb(Zr,Ti)$O_3$) film 38 of a thickness of, for example, 100 nm is used in place of the BST film 15. The other structure is the same as in the first embodiment.

The same effect as in the first embodiment can be obtained as well by the sixth embodiment as described above. PZT is a composite oxide with higher dielectric constant, allowing obtaining higher capacitance.

Note that the PZT film 38 can be formed, for example, by a spattering method after the formation of the Pt film 14. Further, the film forming conditions for the spattering of the PZT film 38 is: substrate temperature; 400° C., $Ar/O_2$ ratio; 9/1, gas pressure; 0.5 Pa, and applied power; 120 W, for example. By performing a film formation processing under the above-described conditions for 60 minutes, the PZT film 38 of a dielectric constant of about 200 can be obtained. The processing followed is the same as in the first embodiment.

Seventh Embodiment

Figure 9:
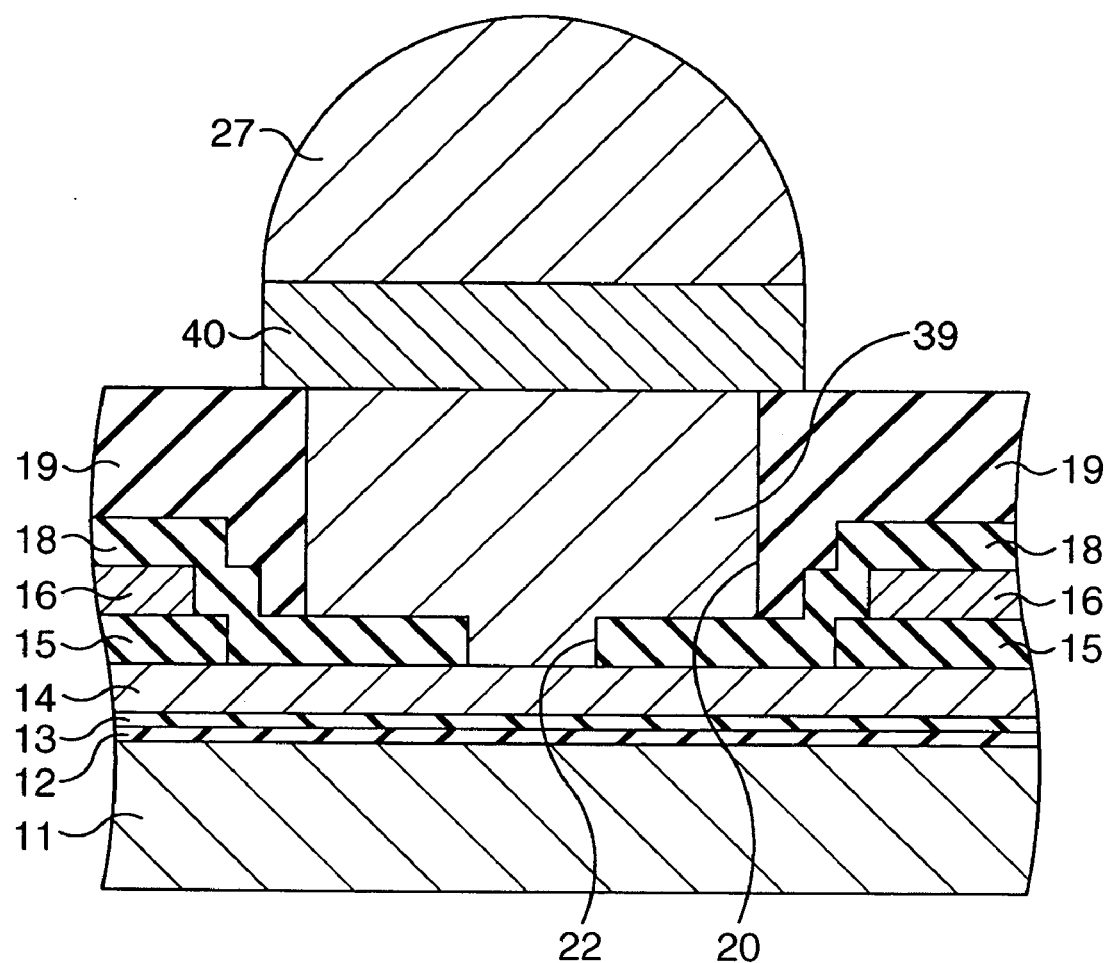
FIG. 9 is a sectional view showing the vicinity of the solder bump 27 of the thin-film capacitor according to a seventh embodiment in an enlarged manner.

Next, a seventh embodiment according to the present invention will be described. FIG. 9 is a sectional view showing the vicinity of the solder bump 27 of the thin-film capacitor according to the seventh embodiment in an enlarged manner.

In the seventh embodiment, a conductive layer 39 formed by curing a conductive paste is buried in the openings 20 and 22. It is not shown, though, the conductive layer 39 is buried in the openings 21 and 23 in the same manner. As a conductive paste, an Ag paste, a carbon paste or the like is used. An Ni layer 40 is formed on the conductive layer 39 and the solder bump 27 is formed thereon.

The same effect as in the first embodiment can be obtained as well by the seventh embodiment as described above. Further, the Young's modulus of the conductive paste is about $0.1 \times 10^{10}$ Pa~$1 \times 10^{10}$ Pa, which is extremely low as compared to the Young's modulus of Ni ($19.95 \times 10^{10}$ Pa~$21.92 \times 10^{10}$ Pa). Therefore, the stress from outside is hard to be transmitted, so that the peel-off and the like can be prevented further. The filling of the conductive paste can be performed by a screen method.

If the thickness of the Ni layer 40 is below 1 µm, when the solder bump 27 is formed, the composing element thereof possibly diffuses into the conductive layer 39 and the like. Meanwhile, if the thickness of the Ni layer 40 is over 10 µm, the height from the surface of the polyimide film 19 to the top of the solder bump 27 is too high, so that structural instability may be caused. Therefore, the thickness of the Ni layer 40 is preferably about 1 µm to 10 µm.

Eighth Embodiment

Figure 10:
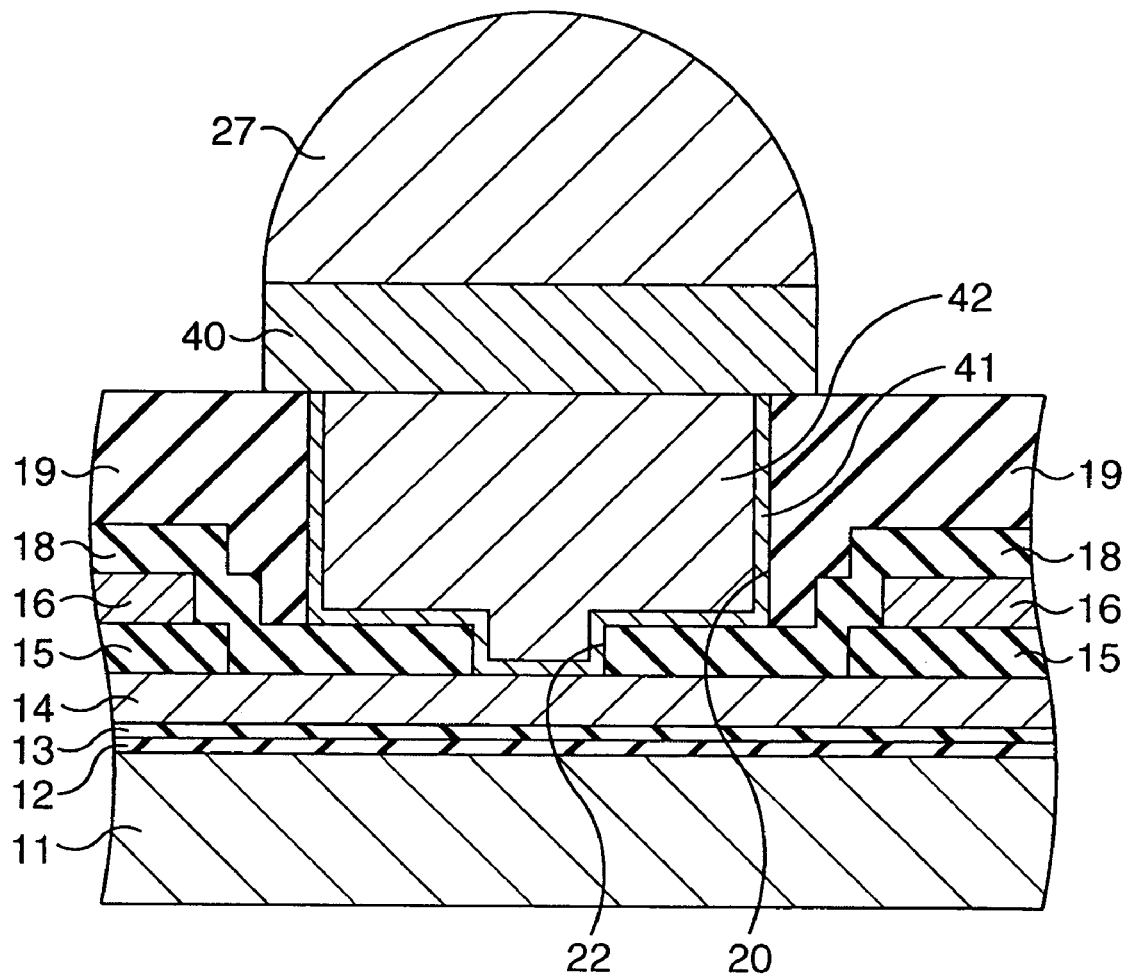
FIG. 10 is a sectional view showing the vicinity of the solder bump 27 of the thin-film capacitor according to an eighth embodiment in an enlarged manner.
Figure 11:
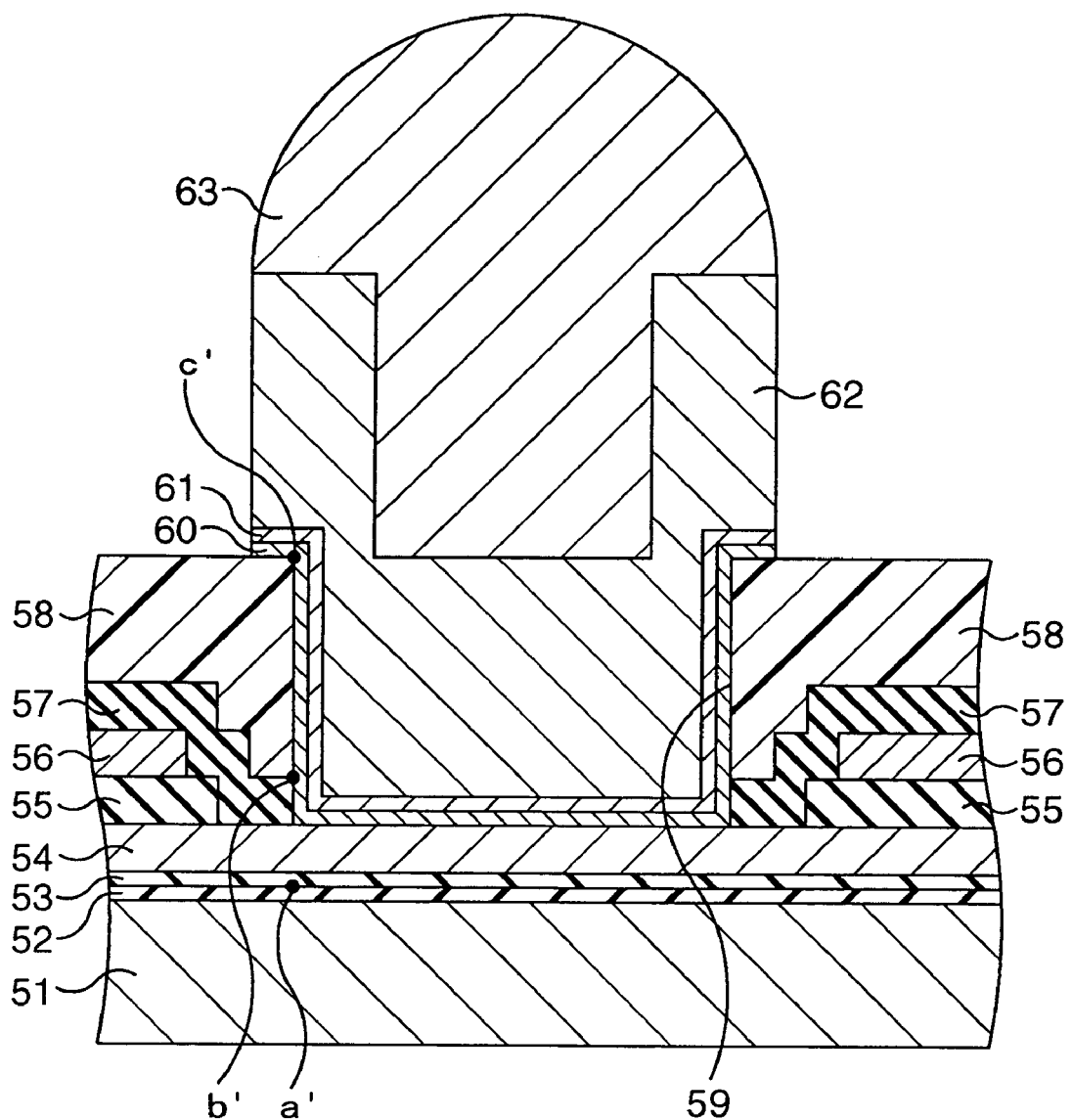
FIG. 11 is a sectional view showing a structure of a conventional thin-film capacitor.
Figure 12:
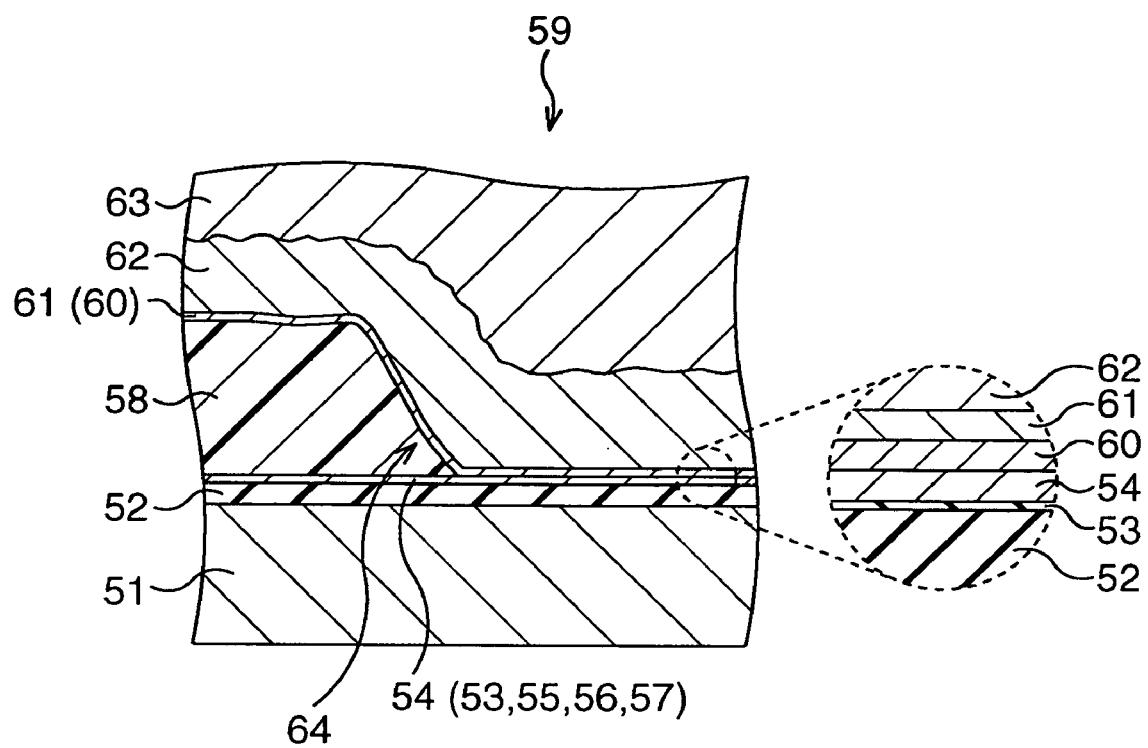
FIG. 12 is a view reproducing a photomicrograph taking the section in the vicinity of the electrode and the solder bump of an actual thin-film capacitor.

Next, an eighth embodiment according to the present invention will be described. FIG. 10 is a sectional view showing the vicinity of the solder bump 27 of the thin-film capacitor according to the eighth embodiment in an enlarged manner.

In the eighth embodiment, on the side and bottom faces of the openings 20 and 22, a Cr film 41 of a thickness of, for example, 50 nm is formed, and a Cu film 42 is formed therein. It is not shown, though, the Cr film 41 and the Cu film 42 are formed in the openings 21 and 23 in the same manner. Then, the Ni layer 40 is formed on the Cu film 42, and the solder bump 27 is formed thereon.

The same effect as in the first embodiment can be obtained as well by the eighth embodiment as described above. Further, the Young's modulus of Cu is about $12.98 \times 10^{10}$ Pa, which is extremely low as compared to the Young's modulus of Ni ($19.95 \times 10^{10}$ Pa~$21.92 \times 10^{10}$ Pa). Therefore, the stress from outside is hard to be transmitted, so that the peel-off and the like can be prevented further.

Incidentally, when manufacturing the thin-film capacitor according to the eighth embodiment, after the openings 22 and 23 are formed, the Cr film 41 is formed. Subsequently, on the Cr film 41, a Cu film of a thickness of about 500 nm is formed as a plating seed layer, for example, by a spattering method. Next, the Cu film is buried onto the plating seed layer by an electric field plating method.

Further, it is possible to combine the seventh embodiment or the eighth embodiment and one of the second to sixth embodiments. Furthermore, even the materials other than the conductive paste and Cu, the same effect can be obtained, as long as the Young's modulus of the material is $15 \times 10^{10}$ Pa or less.

Note the present invention is not limited to the conditions, values and the like described in the above-described embodiments.

For instance, a glass substrate may be used in place of the silicon substrate 1 as long as the glass substrate has heat resistance of the film forming temperature, and a sapphire substrate may be used as well.

Further, as a material for the organic protective film, a photosensitive resin film is preferably used, and, for example, a Bismaleimide-Triazine (BT) resin, a polytetrafluorethylene (PTFE) resin, a benzocyclobutene (BTB) resin, an acrylic resin, a diallyl phthalate resin, or the like may be used.

Further, as a material for the dielectric film, the other composite oxide containing Sr, Ba, Pb, Zr, Bi, Ta, Ti, Mg and/or Nb may be used. With the use of such a composite oxide, lager capacitance can be obtained as compared to the case where $Al_2O_3$ or the like is used.

Further, as a formation method of the dielectric film, for example, metal organic chemical vapor deposition (MOCVD) method may be adopted.

Also, as an inorganic protective film, $SiO_2$, SiON or the like may be used. Further, as an inorganic protective film, the film made of the same material as of the dielectric film (for example, an amorphous metal oxide film) may be used.

Besides, as an electrode of the thin-film capacitor element, a Cr film, a Cu film, a W film, a Pd film, a Ru film, a Ru oxide film, an Ir film, a Pt oxide or the like may be used. Furthermore, a multi-layered body formed by combining these may be used. For instance, as a top electrode, a multi-layered body composed of an $IrO_x$ film (thickness: 50 nm) and an Au film (thickness: 100 nm) formed thereon may be used. Note that the chemistry between the material(s) of the dielectric film is preferably taken into consideration in selecting the material for the electrode.

In addition, as in the second embodiment, two or more of the second openings may be provided for a single first opening. Furthermore, the number of the second opening(s) for the bottom electrode and the number of the second opening(s) for the top electrode may be different from each other.

According to the present invention, the organic protective film made of a photosensitive resin or the like is provided with the first opening, and the inorganic protective film positioning therebeneath is provided with the second opening being smaller than the first opening, so that the stress from the bump can be prevented without reducing the first opening more than necessary. Therefore, the peeling off of the film caused by the effect of the stress can be prevented, so that the yield can be increased and, further, the characteristic reliability can be improved.

In should be noted that any of the above-described embodiments are merely concrete examples to implement the present invention, and it is to be understood that the technical scope of the present invention will not be construed restrictive by these embodiments. In other words, the present invention can be realized in various forms without departing from the technological spirit and the main features thereof.

What is claimed is:
1. A thin-film capacitor comprising:
   a thin-film capacitor element having a bottom conductive film, a top conductive film and a dielectric film sandwiched therebetween;
   an inorganic protective film covering said thin-film capacitor element and having second openings formed therein, each of the second openings exposing at least a part of said bottom conductive film;
   an organic protective film covering said thin-film capacitor element from above said inorganic protective film and having a first opening formed therein, the first opening exposing said second openings and being larger than said second openings; and
   a bump connected with said bottom conductive film via the first and second openings,
   wherein a contact area between said inorganic protective film and said bottom conductive film is larger than an area of said second openings,
   wherein a diameter of each of said second openings is equal to or smaller than one eighth of a diameter of said first opening,
   wherein all of a side surface of said bump, except for a portion in said second openings, is in contact with said organic protective film,
   wherein there is a step between said dielectric film and said bottom conductive film, wherein said inorganic protective film has a following portion which follows said step,
wherein a normal direction of a surface of said following portion changes according to said step,
wherein said inorganic protective film further has a flat portion closer to said bottom conductive film than said following portion, and
wherein said second opening is formed in said flat portion.

2. The thin-film capacitor according to claim 1, wherein a photosensitive resin film is formed as said organic protective film.

3. The thin-film capacitor according to claim 2, wherein one kind of film selected from a group consisting of a polyimide resin film, an epoxy resin film, a Bismaleimide-Triazine resin film, a polytetrafluorethylene resin film, a benzocyclobutene resin film, an acrylic resin film and a diallyl phthalate resin film is formed as said photosensitive resin film.

4. The thin-film capacitor according to claim 1, wherein a composite oxide film containing at least one kind of element selected from a group consisting of Sr, Ba, Pb, Zr, Bi, Ta, Ti, Mg and Nb is formed as said dielectric film.

5. The thin-film capacitor according to claim 1, wherein an amorphous metal oxide film is formed as said dielectric film.

6. The thin-film capacitor according to claim 1, wherein one kind of film selected from a group consisting of an $Al_2O_3$ film, an $SiO_2$ film, an $Si_3N_4$ film and an SiON film is formed as said inorganic protective film.

7. The thin-film capacitor according to claim 1, wherein a film made of a same material as of said dielectric film is used as said inorganic protective film.

8. The thin-film capacitor according to claim 1, wherein at least one kind of film selected from a group of consisting of an Au film, a Cr film, a Cu film, a W film, a Pt film, a Pd film, a Ru film, a Ru oxide film, an Ir film, an Ir oxide film and a Pt oxide film is formed as the bottom conductive film.

9. The thin-film capacitor according to claim 1, wherein said thin-film capacitor element is formed above one kind of substrate selected from a group consisting of a silicon substrate, a glass substrate and a sapphire substrate.

10. A manufacturing method of a thin-film capacitor, comprising:
forming a thin-film capacitor element having a bottom conductive film, a top conductive film and a dielectric film sandwiched therebetween above a substrate;
forming an inorganic protective film covering said thin-film capacitor element;
forming an organic protective film covering said thin-film capacitor element from above said inorganic protective film;
forming a first opening in said organic protective film;
forming second openings at such portions of said inorganic protective film that are exposed from said first opening, each of said second openings exposing at least a part of said bottom conductive film and being smaller than said first opening; and
forming a bump to be connected with said bottom conductive film via said first and second openings,
wherein a contact area between said inorganic protective film and said bottom conductive film is larger than an area of said second openings,
wherein a diameter of each of said second openings is equal to or smaller than one eighth of a diameter of said first opening,
wherein all of a side surface of said bump, except for a portion in said second openings, is in contact with said organic protective film,
wherein there is a step between said dielectric film and said bottom conductive film,
wherein said inorganic protective film has a following portion which follows said step,
wherein a normal direction of a surface of said following portion changes according to said step,
wherein said inorganic protective film further has a flat portion closer to said bottom conductive film than said following portion, and
wherein said second opening is formed in said flat portion.

* * * * *